(12) United States Patent
Matsubara et al.

(10) Patent No.: US 8,633,087 B2
(45) Date of Patent: Jan. 21, 2014

(54) METHOD OF MANUFACTURING GAN-BASED SEMICONDUCTOR DEVICE

(75) Inventors: Hideki Matsubara, Itami (JP); Kuniaki Ishihara, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/814,037

(22) PCT Filed: Mar. 26, 2012

(86) PCT No.: PCT/JP2012/057760
§ 371 (c)(1),
(2), (4) Date: Feb. 4, 2013

(87) PCT Pub. No.: WO2012/147436
PCT Pub. Date: Nov. 1, 2012

(65) Prior Publication Data
US 2013/0137220 A1    May 30, 2013

(30) Foreign Application Priority Data

Apr. 25, 2011 (JP) .................................. 2011-097208

(51) Int. Cl.
*H01L 21/46* (2006.01)
(52) U.S. Cl.
USPC .......................................... 438/455; 438/478
(58) Field of Classification Search
USPC ................................................ 438/455, 478
See application file for complete search history.

(56) References Cited

U.S. PATENT DOCUMENTS

| | | |
|---|---|---|
| 6,559,075 B1 | 5/2003 | Kelly et al. |
| 2004/0029359 A1 | 2/2004 | Letertre et al. |
| 2004/0241975 A1 | 12/2004 | Faure et al. |
| 2006/0172506 A1 | 8/2006 | Bruderl et al. |
| 2012/0122301 A1* | 5/2012 | Fujiwara et al. ............. 438/478 |
| 2013/0149847 A1* | 6/2013 | Satoh et al. ................. 438/479 |

FOREIGN PATENT DOCUMENTS

| | | |
|---|---|---|
| JP | 2001-501778 | 2/2001 |
| JP | 2002-175985 | 6/2002 |
| JP | 2004-517472 | 6/2004 |
| JP | 2005-47792 | 2/2005 |
| JP | 2006-179922 | 7/2006 |
| JP | 2008-277409 | 11/2008 |
| JP | 2009-111101 | 5/2009 |
| JP | 2010-56457 | 3/2010 |
| JP | 2010-232263 | 10/2010 |
| WO | 2010/150659 | 12/2010 |

OTHER PUBLICATIONS

O.B. Shchekin et al., "High performance thin-film flip-chip InGaN—GaN light-emitting diodes", Applied Physics Letters, 2006, pp. 071109-1-071109-3, vol. 89, issue 7.

* cited by examiner

*Primary Examiner* — Bradley K Smith
(74) *Attorney, Agent, or Firm* — Drinker Biddle & Reath LLP

(57) ABSTRACT

A method of manufacturing a GaN-based semiconductor device includes the steps of: preparing a composite substrate including: a support substrate having a thermal expansion coefficient at a ratio of not less than 0.8 and not more than 1.2 relative to a thermal expansion coefficient of GaN; and a GaN layer bonded to the support substrate, using an ion implantation separation method; growing at least one GaN-based semiconductor layer on the GaN layer of the composite substrate; and removing the support substrate of the composite substrate by dissolving the support substrate. Thus, the method of manufacturing a GaN-based semiconductor device is provided by which GaN-based semiconductor devices having excellent characteristics can be manufactured at a high yield ratio.

6 Claims, 5 Drawing Sheets

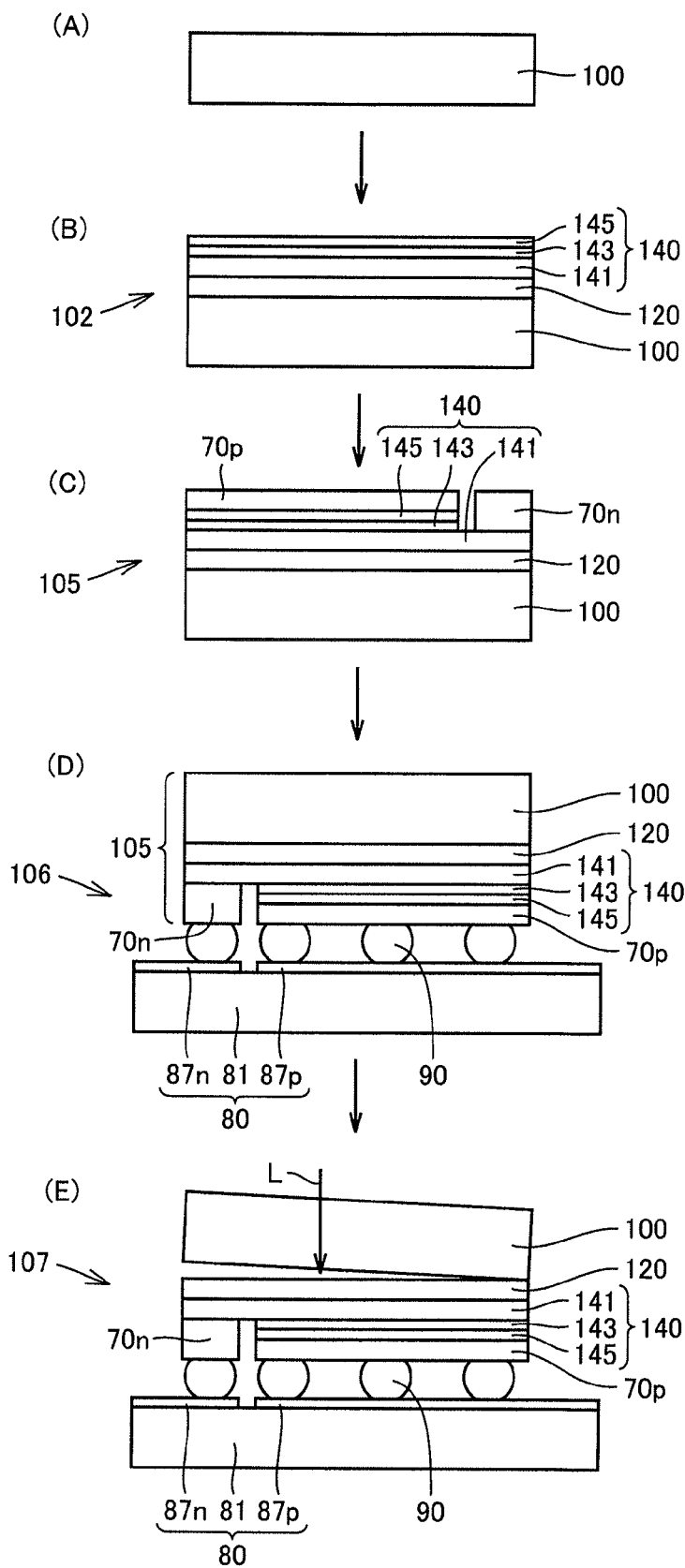

METHOD OF MANUFACTURING GAN-BASED SEMICONDUCTOR DEVICE

TECHNICAL FIELD

The present invention relates to a method of manufacturing a GaN-based semiconductor device by which GaN-based semiconductor devices having excellent characteristics can be manufactured at a high yield.

BACKGROUND ART

As a common method of manufacturing a GaN-based semiconductor device, Japanese National Patent Publication No. 2001-501778 (PTL1) (corresponding to WO1998/014986) and O. B. Shchekin, et al., "High performance thin-film flip-chip InGaN—GaN light-emitting diodes," APPLIED PHYSICS LETTERS 89, 071109 (2006), pp. 071109-1 to 071109-3 (NPL 1) disclose a method by which a GaN-based semiconductor layer is epitaxially grown on a sapphire substrate which is a base substrate, the GaN-based semiconductor layer is transferred onto a transfer support substrate or mounted on a mount substrate, and thereafter the sapphire substrate is removed from the GaN-based semiconductor layer by laser lift-off.

CITATION LIST

Patent Literature
PTL 1: Japanese National Patent Publication No. 2001-501778 (WO1998/014986)
Non Patent Literature
NPL 1: O. B. Shchekin, et al., "High performance thin-film flip-chip InGaN—GaN light-emitting diodes," APPLIED PHYSICS LETTERS 89, 071109 (2006), pp. 071109-1 to 071109-3

SUMMARY OF INVENTION

Technical Problem

According to the method of manufacturing a GaN-based semiconductor device disclosed in the above-referenced Japanese National Patent Publication No. 2001-501778 (PTL1) and O. B. Shchekin, et al., "High performance thin-film flip-chip InGaN—GaN light-emitting diodes," APPLIED PHYSICS LETTERS 89, 071109 (2006), pp. 071109-1 to 071109-3 (NPL 1), laser lift-off is used for removing the sapphire substrate which is the base substrate. Therefore, significant damage is caused to the GaN-based semiconductor layer and the surface morphology of the GaN-based semiconductor layer after the sapphire substrate is removed therefrom is deteriorated, resulting in problems that the characteristics of obtained GaN-based semiconductor devices are deteriorated and the yield decreases.

An object of the present invention is to solve the problems above and thereby provide a method of manufacturing a GaN-based semiconductor device by which GaN-based semiconductor devices having excellent characteristics can be manufactured at a high yield.

Solution to Problem

According to an aspect of the present invention, a method of manufacturing a GaN-based semiconductor device includes the steps of: preparing a composite substrate including: a support substrate having a thermal expansion coefficient at a ratio of not less than 0.8 and not more than 1.2 relative to a thermal expansion coefficient of GaN; and a GaN layer bonded to the support substrate, using an ion implantation separation method; growing at least one GaN-based semiconductor layer on the GaN layer of the composite substrate; and removing the support substrate of the composite substrate by dissolving the support substrate.

The method of manufacturing a GaN-based semiconductor device according to the present invention may further include the steps of: bonding a transfer support substrate to the GaN-based semiconductor layer, after the step of growing the GaN-based semiconductor layer and before the step of removing the support substrate by dissolving the support substrate; and fabricating the transfer support substrate and the GaN-based semiconductor layer into a device and a chip after the step of removing the support substrate by dissolving the support substrate.

The method of manufacturing a GaN-based semiconductor device according to the present invention may further include the steps of: fabricating the GaN-based semiconductor layer grown on the composite substrate into a device and a chip; and mounting the GaN-based semiconductor layer fabricated into a device and a chip on a mount substrate, after the step of growing the GaN-based semiconductor layer and before the step of removing the support substrate by dissolving the support substrate.

Regarding the method of manufacturing a GaN-based semiconductor device according to the present invention, the support substrate may include at least one selected from the group consisting of molybdenum and a composite oxide of aluminum oxide and silicon oxide.

Advantageous Effects of Invention

In accordance with the present invention, a method of manufacturing a GaN-based semiconductor device can be provided by which GaN-based semiconductor devices having excellent characteristics can be manufactured at a high yield.

BRIEF DESCRIPTION OF DRAWINGS

FIG. 5 is a schematic cross section showing another example of the common method of manufacturing a GaN-based semiconductor device.

DESCRIPTION OF EMBODIMENTS

Embodiment 1

Figure 1:
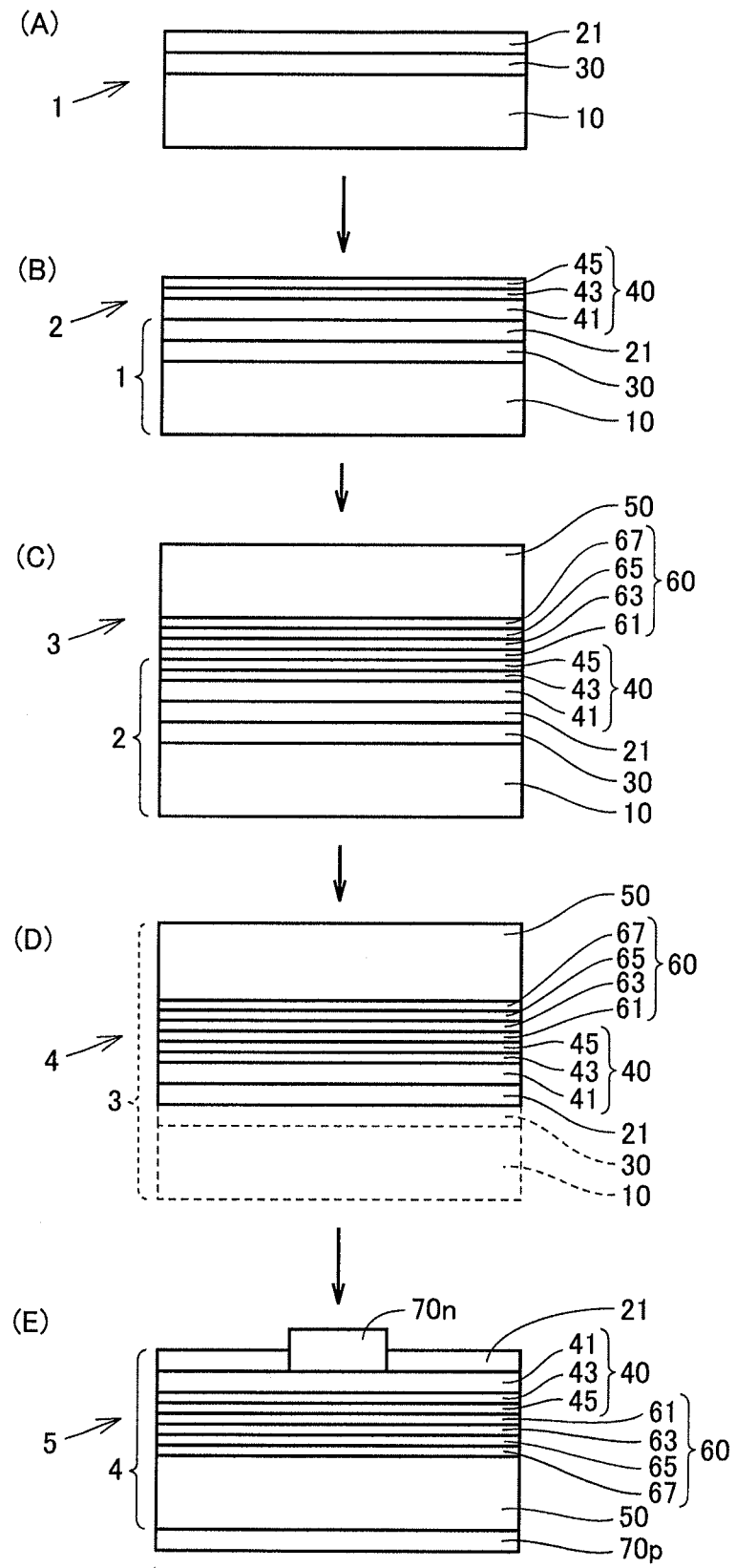
FIG. 1 is a schematic cross section showing an example of the method of manufacturing a GaN-based semiconductor device according to the present invention.
Figure 2:
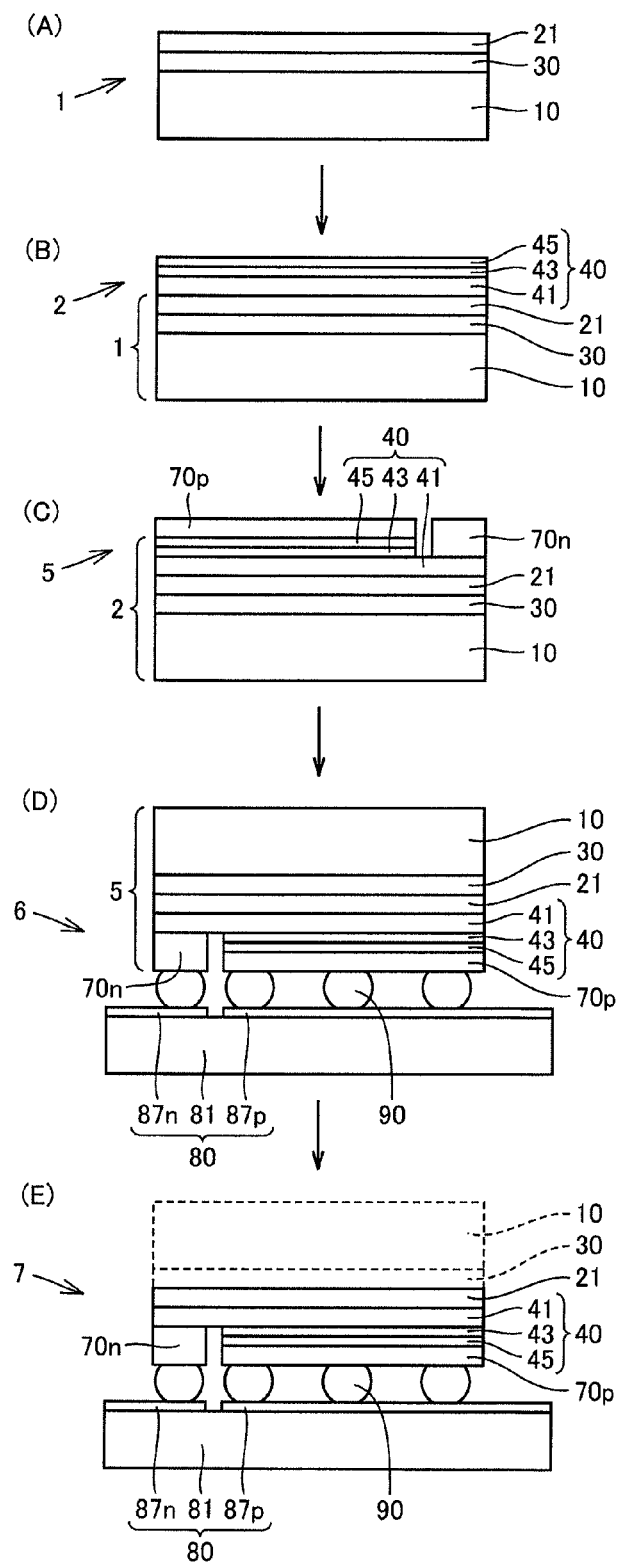
FIG. 2 is a schematic cross section showing another example of the method of manufacturing a GaN-based semiconductor device according to the present invention.

Referring to FIGS. 1 and 2, a method of manufacturing a GaN-based semiconductor device in an embodiment of the present invention includes: the step (FIG. 1(A) and FIG. 2(A)) of preparing a composite substrate 1 including: a support substrate 10 having a thermal expansion coefficient at a ratio of not less than 0.8 and not more than 1.2 relative to a thermal expansion coefficient of GaN; and a GaN layer 21 bonded to support substrate 10, using an ion implantation separation method; the step (FIG. 1(B) and FIG. 2(B)) of growing at least one GaN-based semiconductor layer 40 on GaN layer 21 of composite substrate 1; and the step (FIG. 1(D) and FIG. 2(E)) of removing support substrate 10 of composite substrate 1 by dissolving support substrate 10.

The method of manufacturing a GaN-based semiconductor device in the present embodiment uses composite substrate 1 which includes: support substrate 10 having a thermal expansion coefficient at a ratio falling in a range of not less than 0.8 and not more than 1.2 relative to a thermal expansion coefficient of GaN and substantially identical or sufficiently close to the thermal expansion coefficient of GaN; and GaN layer 21 bonded to support substrate 10. Therefore, on GaN layer 21 of composite substrate 1, GaN-based semiconductor layer 40 of high quality can be grown without occurrence of warp and cracks. In addition, since support substrate 10 of composite substrate 1 is dissolved to be removed after GaN-based semiconductor layer 40 is grown, less damage is caused to GaN-based semiconductor layer 40, and GaN layer 21 from which support substrate 10 is removed has good surface morphology. Thus, semiconductor devices having excellent characteristics can be obtained at a high yield.

The method of manufacturing a GaN-based semiconductor device in the present embodiment may further include the following steps as described in more detail below.

Embodiment 1A

Referring to FIG. 1, more specific Embodiment 1A of Embodiment 1 further includes the step (FIG. 1(C)) of bonding a transfer support substrate 50 to GaN-based semiconductor layer 40 after the step (FIG. 1(B)) of growing GaN-based semiconductor layer 40 and before the step (FIG. 1(D)) of removing support substrate 10 by dissolving support substrate 10, and includes the step (FIG. 1(E)) of fabricating transfer support substrate 50 and GaN-based semiconductor layer 40 into a device and a chip after the step (FIG. 1(D)) of removing support substrate 10 by dissolving support substrate 10. In accordance with the method of manufacturing a GaN-based semiconductor device in the present embodiment, vertical GaN-based semiconductor devices having excellent characteristics can be obtained at a high yield. In the following, each of the steps will be described in detail.

Step of Preparing Composite Substrate

Referring first to FIG. 1(A), the method of manufacturing a GaN-based semiconductor device of the present embodiment includes the step of preparing composite substrate 1 including: support substrate 10 having a thermal expansion coefficient at a ratio of not less than 0.8 and not more than 1.2 relative to a thermal expansion coefficient ($6.0 \times 10^{-6}$ °C.$^{-1}$) of GaN; and GaN layer 21 bonded to support substrate 10, using an ion implantation separation method.

Here, the ion implantation separation method refers to a method by which specific ions are implanted into a semiconductor substrate, the ions are vaporized by heat treatment or the like, and a stress generated at this time is used to separate a thin semiconductor layer from the semiconductor substrate.

Support substrate 10 is not particularly limited as long as support substrate 10 has an expansion coefficient at a ratio of not less than 0.8 and not more than 1.2 relative to the thermal expansion coefficient of GaN. In terms of the fact that reduction of the difference between their respective thermal expansion coefficients will more effectively prevent warp and cracks that may occur when GaN-based semiconductor layer 40 is grown, the ratio of the thermal expansion coefficient of support substrate 10 is preferably not less than 0.9 and not more than 1.05. Moreover, in view of the fact that support substrate 10 is to be dissolved to be removed, support substrate 10 is required to be a material that is dissolved in a specific solvent.

In terms of the above, preferably support substrate 10 includes for example at least one selected from the group consisting of Mo (molybdenum) and $Al_2O_3$—$SiO_2$ (aluminum oxide-silicon oxide) composite oxide. This composite oxide also includes mullite in which $Al_2O_3$:$SiO_2$ is 0.6:0.4. More preferably, the substrate is selected from an Mo substrate and a composite oxide substrate in which $Al_2O_3$:$SiO_2$ is 0.64:0.36. Here, the Mo substrate has a thermal expansion coefficient of $6.0 \times 10^{-6}$ °C.$^{-1}$ and the composite oxide substrate in which $Al_2O_3$:$SiO_2$ is 0.64:0.36 has a thermal expansion coefficient of $5.5 \times 10^{-6}$ °C.$^{-1}$. Their respective thermal expansion coefficients are substantially identical or sufficiently close to the thermal expansion coefficient ($6.0 \times 10^{-6}$ °C.$^{-1}$) of GaN. It should be noted that the thermal expansion coefficient used herein is a value at room temperature (25° C. and temperatures thereabound). The Mo substrate is dissolved in nitric acid and the composite oxide substrate in which $Al_2O_3$:$SiO_2$ is 0.64:0.36 is dissolved in hydrofluoric acid.

The step of preparing composite substrate 1 is not particularly limited. In terms of efficient manufacture of composite substrate 1, however, the following sub-step is preferably included as shown in FIG. 3.

Figure 3:
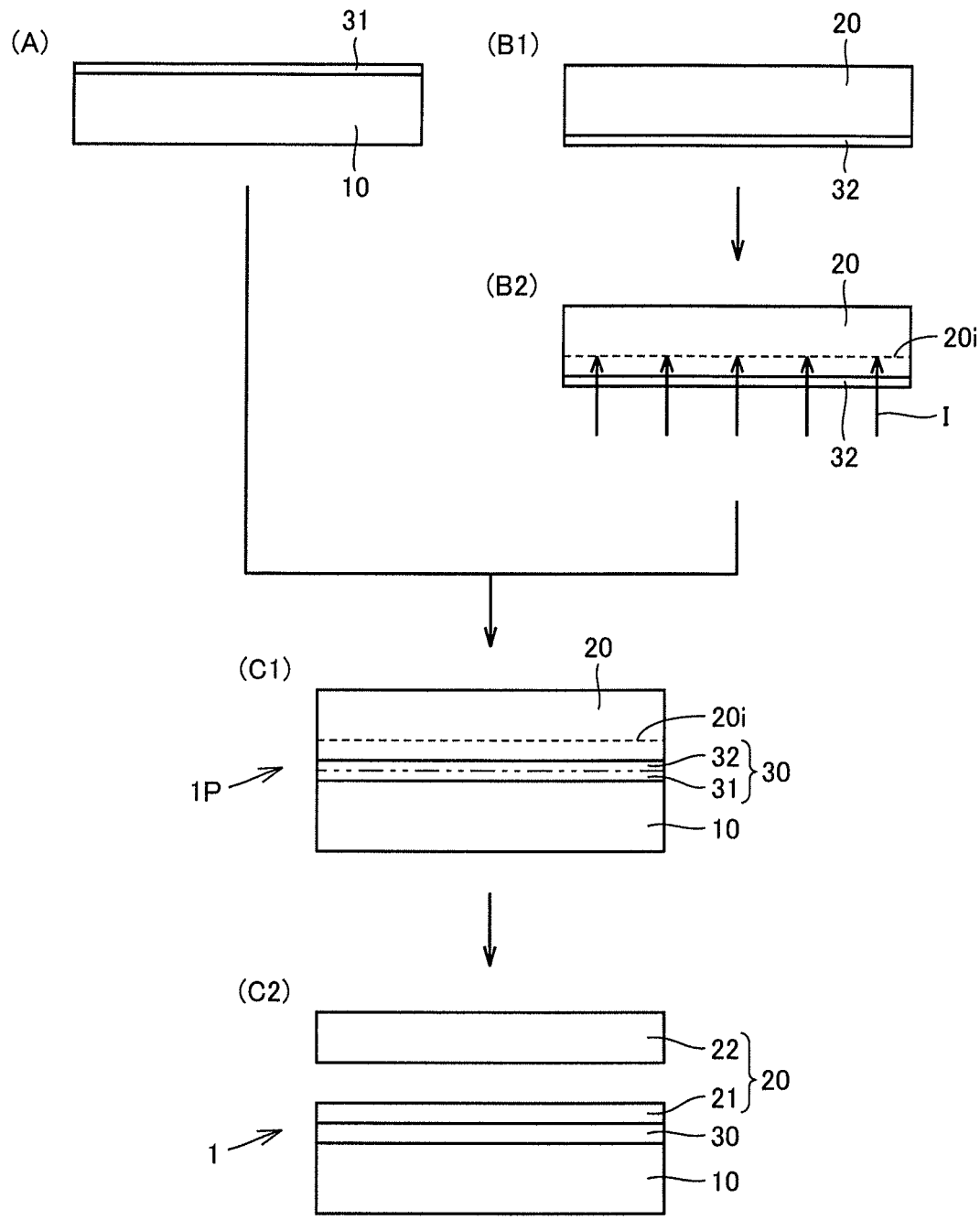
FIG. 3 is a schematic cross section showing an example of the step of preparing a composite substrate in the method of manufacturing a GaN-based semiconductor device according to the present invention.

Referring to FIG. 3(B1), the step of preparing composite substrate 1 includes the sub step of forming a joint layer 32 such as $SiO_2$ layer, $Si_xN_y$ layer or the like on one main surface of a GaN substrate 20, by CVD (Chemical Vapor Deposition) method, sputtering method, vacuum deposition method or the like. Then, referring to FIG. 3(B2), the step of preparing composite substrate 1 includes the sub step of implanting ions I with a low mass number such as hydrogen, helium or the like, from the main surface side where joint layer 32 of GaN substrate 20 is formed, to thereby form an ion implantation region 20i in a region of a predetermined depth from the main surface where joint layer 32 of GaN substrate 20 is formed. Such an ion implantation region 20i is embrittled relative to other regions.

Referring to FIG. 3(A), the step of preparing composite substrate 1 includes the sub step of forming a joint layer 31 such as $SiO_2$ layer, $Si_xN_y$ layer or the like on one main surface of support substrate 10, by CVD (Chemical Vapor Deposition) method, sputtering method, vacuum deposition method or the like.

Here, as to the order in which the sub steps of forming joint layer 32 on GaN substrate 20 and forming ion implantation region 20i in GaN substrate 20 shown respectively in (B1) and (B2) of FIG. 3 are performed, and the sub step of forming joint layer 31 on support substrate 10 shown in FIG. 3(A) is performed, it does not matter which is performed first.

Then, referring to FIG. 3(C1), the step of preparing composite substrate 1 includes the sub step of bonding joint layer 32 formed on GaN substrate 20 and joint layer 31 formed on support substrate 10 to each other. This sub step can be performed to obtain a joined substrate 1P in which support substrate 10 and GaN substrate 20 are bonded to each other between which a joint layer 30 into which joint layers 31, 32 are integrated is interposed.

Then, referring to FIG. 3(C2), the step of preparing composite substrate 1 includes the sub step of separating, along ion implantation region 20i, GaN substrate 20 into GaN layer 21 bonded to support substrate 10 and a remaining GaN substrate 22, by applying heat or stress to joined substrate 1P. This sub step can be performed to obtain composite substrate 1 in which GaN layer 21 is bonded onto support substrate 10 with joint layer 30 interposed therebetween.

While the description of the step of preparing a composite substrate has been given regarding the case where joint layers 31, 32 are formed on both support substrate 10 and GaN substrate 20, the joint layer may be formed and bonded to only one of support substrate 10 and GaN substrate 20, or support substrate 10 and GaN substrate 20 on which no joint layer is formed can also be bonded to each other.

Step of Growing GaN-Based Semiconductor Layer

Referring next to FIG. 1(B), the method of manufacturing a GaN-based semiconductor device of the present embodiment includes the step of growing at least one GaN-based semiconductor layer 40 on GaN layer 21 of composite substrate 1. This step can be performed to obtain a semiconductor-layer-attached composite substrate 2 in which at least one GaN-based semiconductor layer 40 is formed on GaN layer 21 of composite substrate 1. Here, GaN-based semiconductor layer 40 refers to a group III nitride semiconductor layer containing Ga as a group III element, and examples of the GaN-based semiconductor layer may include $Al_xIn_yGa_{1-x-y}N$ layer ($0 \leq x$, $0 \leq y$, $x+y<1$) and the like.

Regarding the step of growing GaN-based semiconductor layer 40, the method for growing GaN-based semiconductor layer 40 is not particularly limited. In terms of growth of GaN-based semiconductor layer 40 of high quality, however, suitable examples of the method may include MOVPE (Metal Organic Vapor Phase Epitaxy) method, MBE (Molecular Beam Epitaxy) method, HVPE (Hydride Vapor Phase Epitaxy) method, and the like.

The makeup of GaN-based semiconductor layer 40 to be grown varies depending on the type of the GaN-based semiconductor device to be fabricated. For example, in the case where the GaN-based semiconductor device is a light emitting device such as LED (Light Emitting Diode) and LD (Laser Diode), GaN-based semiconductor layer 40 includes an n-type semiconductor layer 41, an active layer 43, and a p-type semiconductor layer 45 for example.

Step of Bonding Transfer Support Substrate to GaN-Based Semiconductor Layer

Referring next to FIG. 1(C), the method of manufacturing a GaN-based semiconductor device of the present embodiment includes the step of bonding transfer support substrate 50 to GaN-based semiconductor layer 40. This step can be performed to obtain a joined substrate body 3 in which composite substrate 1, GaN-based semiconductor layer 40, and transfer support substrate 50 are bonded to each other in this order.

Transfer support substrate 50 used in the step of bonding the transfer support substrate to the GaN-based semiconductor layer is not particularly limited as long as it can support GaN-based semiconductor layer 40. In terms of formation of a vertical device, however, the transfer support substrate is preferably an electrically conductive substrate, and suitable examples may include Ge substrate, Si substrate, polycrystalline AlN substrate, and the like.

How to bond transfer support substrate 50 to GaN-based semiconductor layer 40 is not particularly limited. In terms of good joint and electrical connection between GaN-based semiconductor layer 40 and transfer support substrate 50, preferably a connection layer 60 is interposed therebetween. Specifically, on GaN-based semiconductor layer 40, a p-side ohmic electrode layer 61 and a solder layer 63 are formed as a part of connection layer 60 and, on transfer support substrate 50, an ohmic electrode layer 67 and a metal pad layer 65 are formed as a part of connection layer 60. Solder layer 63 and metal pad layer 65 are bonded to each other to thereby join GaN-based semiconductor layer 40 and transfer support substrate 50 with connection layer 60 interposed therebetween. Here, an Ni/Au electrode layer for example is suitably used as p-side ohmic electrode layer 61, an Au—Sn solder layer for example is suitably used as solder layer 63, an Au pad layer for example is suitably used as metal pad layer 65, and an Ni/Pt/Au electrode layer for example is suitably used as ohmic electrode layer 67.

Instead of p-side ohmic electrode layer 61 and solder layer 63 that are formed as a part of connection layer 60 on GaN-based semiconductor layer 40: a high-reflection p-side ohmic electrode layer (Ni/Au electrode layer for example) and a solder layer (Au-Sn solder layer for example); a transparent p-side ohmic electrode layer (thin Ni/Au electrode layer for example) and a high-reflection metal layer (Al layer for example) and a metal solder layer (Au—Sn solder layer for example); or a transparent p-side ohmic electrode layer (thin Ni/Au electrode layer for example) and a high-reflection metal layer (Al layer for example) and an anti-diffusion metal layer (Pt layer, Mo layer or W layer for example) and a solder layer (Au—Sn solder layer for example), or the like may also be used.

Step of Removing Support Substrate by Dissolving the Same

Referring next to FIG. 1(D), the method of manufacturing a GaN-based semiconductor device of the present embodiment includes the step of removing support substrate 10 of composite substrate 1 in joined substrate body 3 by dissolving support substrate 10. This step can be performed to obtain a semiconductor-layer-attached transfer support substrate 4 in which GaN-based semiconductor layer 40 and transfer support substrate 50 are bonded to each other.

Namely, the step of bonding transfer support substrate 50 to GaN-based semiconductor layer 40 of semiconductor-layer-attached composite substrate 2 and the step of removing support substrate 10 by dissolving it can be performed as described above to thereby transfer GaN-based semiconductor layer 40 from support substrate 10 to transfer support substrate 50.

Here, the solvent in which support substrate 10 is dissolved varies depending on the type of support substrate 10. For example, in the case where support substrate 10 is an Mo substrate, nitric acid (30 mass % of nitric acid aqueous solution for example) is used as the solvent for the substrate. In the case where support substrate 10 is a composite oxide substrate in which $Al_2O_3:SiO_2$ is 0.64:0.36, hydrofluoric acid (20 mass % of hydrofluoric acid aqueous solution for example) is used as the solvent for the substrate.

Furthermore, joint layer 30, which is exposed after support substrate 10 of composite substrate 1 in joined substrate body 3 is dissolved to be removed, is removed by being dissolved. The solvent in which joint layer 30 is dissolved varies depending on the type of joint layer 30. In the case where joint layer 30 is an $SiO_2$ layer, hydrofluoric acid (20 mass % of hydrofluoric acid aqueous solution for example) is used as the solvent for the joint layer.

Here, the exposed main surface of GaN layer 21 of semiconductor-layer-attached transfer support substrate 4 that is obtained by dissolving and thereby removing support substrate 10 and joint layer 30 from joined substrate body 3 is extremely flat relative to the main surface which is exposed in the case where the support substrate and the joint layer are removed by laser lift-off.

It should be noted that, when support substrate 10 and joint layer 30 of joined substrate body 3 are to be removed by being dissolved, it is preferable to protect the transfer support substrate 50 side of joined substrate body 3 with wax (not shown) or the like and/or to remove, in advance, a part of support substrate 10 by grinding or polishing before support substrate 10 is dissolved. In particular, in the case where hydrofluoric acid is used as the solvent, it is preferable to protect transfer support substrate 50 as described above and partially remove support substrate 10 such as $Al_2O_3 \cdot SiO_2$ composite oxide substrate by grinding or polishing before dissolution of support substrate 10.

Fabrication of Transfer Support Substrate and GaN-Based Semiconductor Layer into Device and Chip Referring next to FIG. 1(E), the method of manufacturing a GaN-based semiconductor device of the present embodiment includes the step of fabricating transfer support substrate 50 and GaN-based semiconductor layer 40 of semiconductor-layer-attached transfer support substrate 4 into a device and a chip. Here, fabrication into a device refers to fabrication of a semiconductor device 5 by forming electrodes (p-side electrode 70p and n-side electrode 70n) for example on transfer support substrate 50 and GaN-based semiconductor layer 40. Fabrication into a chip refers to division of semiconductor device 5 into chips of a predetermined size. The method for fabricating chips is not particularly limited, and suitable examples of the method may include scribe-and-break method, dicing method, and the like.

For example, in the case where transfer support substrate 50 of semiconductor-layer-attached transfer support substrate 4 is an electrically conductive substrate, an n-side electrode 70n is formed on GaN-based semiconductor layer 40 and a p-side electrode 70p is formed on transfer support substrate 50 in semiconductor-layer-attached transfer support substrate 4, and further they are fabricated into chips. Accordingly, semiconductor device 5 in the form of a chip which is a vertical device can be obtained.

It should be noted that, since the main surface of semiconductor-layer-attached transfer support substrate 4 that is exposed by dissolving and thereby removing support substrate 10 and joint layer 30 is extremely flat, the surface can be roughened by dry etching or wet etching for the purpose of increasing the light extraction efficiency to thereby form an extremely uniform rough shape as compared with the case where the support substrate and the joint layer are removed by the laser lift-off method.

Embodiment 1B

Referring to FIG. 2, more specific Embodiment 1B of Embodiment 1 further includes the step (FIG. 2(C)) of fabricating, into a device and a chip, GaN-based semiconductor layer 40 grown on composite substrate 1, and the step (FIG. 2(D)) of mounting GaN-based semiconductor layer 40 which has been fabricated into a device and a chip, on a mount substrate 80, after the step (FIG. 2(B)) of growing GaN-based semiconductor layer 40 and before the step (FIG. 2(E)) of removing support substrate 10 by dissolving support substrate 10. The method of manufacturing a GaN-based semiconductor device of the present embodiment can be used to mount lateral GaN-based semiconductor devices having excellent characteristics at a high yield. In the following, each of the steps will be described in detail.

Step of Preparing Composite Substrate

Referring first to FIG. 2(A), the method of manufacturing a GaN-based semiconductor device of the present embodiment includes the step of preparing composite substrate 1 including: support substrate 10 having a thermal expansion coefficient at a ratio of not less than 0.8 and not more than 1.2 relative to a thermal expansion coefficient ($6.0 \times 10^{-6}$ °$C.^{-1}$) of GaN; and GaN layer 21 bonded to support substrate 10, using an ion implantation separation method. Since this step is similar to that of Embodiment 1A described above, the description thereof will not be repeated here.

Step of Growing GaN-Based Semiconductor Layer

Referring next to FIG. 2(B), the method of manufacturing a GaN-based semiconductor device of the present embodiment includes the step of growing at least one GaN-based semiconductor layer 40 on GaN layer 21 of composite substrate 1. This step can be performed to obtain semiconductor-layer-attached composite substrate 2 in which at least one GaN-based semiconductor layer 40 (n-type semiconductor layer 41, active layer 43, and p-type semiconductor layer 45, for example) is formed on GaN layer 21 of composite substrate 1. Since this step is similar to that of Embodiment 1A described above, the description thereof will not be repeated here.

Step of Fabricating GaN-Based Semiconductor Layer into Device and Chip

Referring next to FIG. 2(C), the method of manufacturing a GaN-based semiconductor device of the present embodiment includes the step of fabricating, into a device and a chip, GaN-based semiconductor layer 40 grown on composite substrate 1 of semiconductor-layer-attached composite substrate 2. Here, fabrication into a device refers to fabrication of semiconductor device 5 by forming electrodes (p-side electrode 70p and n-side electrode 70n) for example on GaN-based semiconductor layer 40. Fabrication into a chip refers to division of semiconductor device 5 into chips of a predetermined size. The method for fabricating chips is not particularly limited, and suitable examples of the method may include scribe-and-break method, dicing method, and the like.

For example, on p-type semiconductor layer 45 of GaN-based semiconductor layer 40 in semiconductor-layer-attached composite substrate 2, p-side electrode 70p is formed. Subsequently, a part of p-side electrode 70p as well as a part of p-type semiconductor layer 45 and active layer 43 of GaN-based semiconductor layer 40 are mesa-etched to expose a part of n-type semiconductor layer 41. On the exposed portion of n-type semiconductor layer 41, n-side electrode 70n is formed. Further, chips are fabricated from them to thereby obtain semiconductor device 5 fabricated in the form of a chip as a lateral device. Here, suitable examples of p-side electrode 70p and n-side electrode 70n are similar to those of Example 1A, and the description thereof will not be repeated here.

It should be noted that p-side electrode 70p and n-side electrode 70n are preferably covered with a protective electrode (not shown) formed of a thick-film pad so that they can endure ultrasonic joining in the step of mounting described later herein. In terms of increase of the light extraction efficiency, it is preferable to form a high-reflection metal electrode (not shown) on p-side electrode 70p.

Step of Mounting GaN-Based Semiconductor Layer 40 Fabricated into Device and Chip Referring next to FIG. 2(D), the method of manufacturing a GaN-based semiconductor device of the present embodiment includes the step of mounting, on mount substrate 80, GaN-based semiconductor layer 40 of semiconductor device 5 fabricated into a device and a chip that is obtained by the above-described step of fabrication into a device and a chip. This step can be performed to flip-chip mount lateral semiconductor device 5 on mount substrate 80. While mount substrate 80 used in this step is not particularly limited, mount substrate 80 may include for example an electrically insulating foundation substrate 81 on which a p-side conductive portion 87p and an n-side conductive portion 87n are formed.

The method for mounting semiconductor device 5 on mount substrate 80 is not particularly limited. For example, semiconductor device 5 is mounted on mount substrate 80 in such a manner that a bump 90 formed of a conductive joining material is formed on each of p-side electrode 70*p* and n-side electrode 70*n* of semiconductor device 5, p-side electrode 70*p* of semiconductor device 5 is electrically connected to p-side conductive portion 87*p* of mount substrate 80, and n-side electrode 70*n* of semiconductor device 5 is electrically connected to n-side conductive portion 87*n* of mount substrate 80. This step can be performed to obtain a mounted semiconductor device 6 which is mounted on mount substrate 80.

Moreover, it is preferable to protect, as required, the electrode joint portions (p-side electrode 70*p*, n-side electrode 70*n*, p-side conductive portion 87*p*, n-side conductive portion 87*n*, and bumps 90) as well as their vicinity, with an undercoat (not shown) such as silicone resin.

Step of Removing Support Substrate by Dissolving the Same

Referring next to FIG. 2(E), the method of manufacturing a GaN-based semiconductor device of the present embodiment includes the step of removing support substrate 10 of mounted semiconductor device 6 mounted on mount substrate 80, by dissolving support substrate 10. This step can be performed to obtain mounted semiconductor device 7 by bonding GaN-based semiconductor layer 40 onto mount substrate 80 to thereby mount the semiconductor device.

The solvent and the method for removing support substrate 10 of mounted semiconductor device 6 by dissolving the support substrate are similar to the solvent and the method for dissolving support substrate 10 of joined substrate body 3 in Embodiment 1A, and the description thereof will not be repeated here. Furthermore, in a similar manner to Embodiment 1A, joint layer 30 of mounted semiconductor device 6 is removed by dissolving it.

It should be noted that the exposed main surface of GaN layer 21 of mounted semiconductor device 7 that is obtained by dissolving and thereby removing support substrate 10 and joint layer 30 from mounted semiconductor device 6 is extremely flat, and therefore, when the surface is roughened by dry etching or wet etching for the purpose of increasing the light extraction efficiency, an extremely uniform rough shape, as compared with the case where the support substrate and the joint layer are removed by the laser lift-off method, can be formed.

EXAMPLES

Example 1

1. Preparation of Composite Substrate

Referring to FIG. 1(A), composite substrate 1 was prepared in the following manner in which GaN layer 21 is bonded onto an Mo substrate (support substrate 10) with an $SiO_2$ layer (joint layer 30) interposed therebetween.

Referring to FIG. 3 (B1), GaN substrate 20 having a diameter of 4 inches and a thickness of 600 μm and having two main surfaces that were a (0001) plane (Ga atomic plane) and a (000-1) plane (N atomic plane) was prepared. These main surfaces of GaN substrate 20 had been polished and the RMS (Root Mean Square) roughness (corresponding to Rq of JIS B0601:2001) was measured in a range of 50 μm×50 μm square with an AFM (Atomic Force Microscope), and the measured roughness was 5 nm or less. The dislocation density of GaN substrate 20 was also measured by the cathode luminescence method, and the measured dislocation density was $2 \times 10^5$ cm$^{-2}$.

Subsequently, on the main surface of the (000-1) plane (N atomic plane) of this GaN substrate 20, an $SiO_2$ layer (joint layer 32) of 300 nm in thickness was formed by the plasma CVD method, the formed $SiO_2$ layer (joint layer 32) was precision-polished by CMP (Chemical Mechanical Polishing), and accordingly the $SiO_2$ layer (joint layer 32) of 150 nm in thickness having a flat main surface with an RMS roughness of 1 nm or less was obtained.

Subsequently, referring to FIG. 3 (B2), hydrogen ions were implanted from the $SiO_2$ layer (joint layer 32) formed on the main surface of the (000-1) plane (N atomic plane) of GaN substrate 20, to form ion implantation region 20*i* at a position of 300 nm in depth from the main surface of the (000-1) plane (N atomic plane) of GaN substrate 20.

Referring also to FIG. 3(A), the Mo substrate (support substrate 10) having a diameter of 4 inches (10.16 cm) and a thickness of 600 μm and a purity of 99.99 mass % was prepared. This Mo substrate (support substrate 10) had a thermal expansion coefficient of $6.0 \times 10^{-6\circ}$ C.$^{-1}$ which was substantially identical to the thermal expansion coefficient ($6.0 \times 10^{-6\circ}$ C.$^{-1}$) of GaN. This Mo substrate (support substrate 10) had a polished main surface, the RMS roughness of this main surface was 5 nm or less, and the packing fraction of the Mo substrate was 99 vol % or more (porosity of 1 vol % or less).

Subsequently, on the main surface of this Mo substrate (support substrate 10), an $SiO_2$ layer (joint layer 31) having a thickness of 300 nm was formed by the plasma CVD method, the formed $SiO_2$ layer (joint layer 31) was precision-polished by CMP (Chemical Mechanical Polishing), and accordingly the $SiO_2$ layer (joint layer 31) of 150 nm in thickness having a flat main surface with an RMS roughness of 1 nm or less was obtained.

It should be noted that, as to the order in which the $SiO_2$ layer (joint layer 32) and ion implantation region 20*i* are formed on and in GaN substrate 20 shown in FIG. 3(B1) and FIG. 3(B2), and the $SiO_2$ layer (joint layer 31) is formed on the Mo substrate (support substrate 10) shown in FIG. 3(A), it does not matter which is performed first.

Then, referring to FIG. 3(C1), the $SiO_2$ layer (joint layer 32) formed on GaN substrate 20 and the $SiO_2$ layer (joint layer 31) formed on the Mo substrate (support substrate 10) were mechanically joined to each other so that they face each other. They were thus joined together to obtain joined substrate 1P in which the Mo substrate (support substrate 10) and GaN substrate 20 were bonded to each other between which the $SiO_2$ layer (joint layer 30) of 300 nm in thickness was interposed, into which the $SiO_2$ layer (joint layer 32) and the $SiO_2$ layer (joint layer 31) were integrated.

Then, referring to FIG. 3(C1) and FIG. 3(C2), joined substrate 1P was heated to separate GaN substrate 20 into GaN layer 21 bonded to the Mo substrate (support substrate 10) and remaining GaN substrate 22 along ion implantation region 20*i*, to thereby obtain composite substrate 1 in which GaN layer 21 of 300 nm in thickness was bonded onto the Mo substrate (support substrate 10) of 600 μm in thickness between which the $SiO_2$ layer (joint layer 30) of 300 nm in thickness was interposed.

2. Growth of GaN-Based Semiconductor Layer

Referring next to FIG. 1(B), on GaN layer 21 of composite substrate 1, the MOVPE method was applied to successively grow an n-type GaN layer (n-type semiconductor layer 41), an InGaN multiple-quantum-well active layer (active layer 43), and a p-type GaN contact layer (p-type semiconductor layer 45), to thereby obtain semiconductor-layer-attached composite substrate 2 including GaN-based semiconductor layer 40 having an LED structure and a whole thickness of 5 μm. Since the Mo substrate (support substrate 10), GaN layer 21, and GaN-based semiconductor layer 40 have respective thermal expansion coefficients substantially identical to each other, no warp and crack occurred to semiconductor-layer-attached composite substrate 2.

3. Bonding of Transfer Support Substrate to GaN-Based Semiconductor Layer

Referring next to FIG. 1(C), on the p-type GaN contact layer (p-type semiconductor layer 45) of GaN-based semiconductor layer 40 in semiconductor-layer-attached composite substrate 2, an Ni/Au electrode layer (p-side ohmic electrode layer 61) and an Au—Sn solder layer (solder layer 63) of 3 μm in thickness were formed as a part of connection layer 60 both by the vacuum deposition method.

A Ge substrate (transfer support substrate 50) having a diameter of 4 inches, a thickness of 600 μm, and an RMS roughness of the main surface of 5 nm or less was also prepared. Here, the Ge substrate had a thermal expansion coefficient of $6.1 \times 10^{-6 \circ} C.^{-1}$ which was well close to the thermal expansion coefficient ($6.0 \times 10^{-6 \circ} C.^{-1}$) of GaN. On the main surface of this Ge substrate (transfer support substrate 50), an Ni/Pt/Au electrode layer (ohmic electrode layer 67) and an Au pad layer (metal pad layer 65) of 1 μm in thickness were formed as a part of connection layer 60 both by the vacuum deposition method.

Subsequently, the Au—Sn solder layer (solder layer 63) formed on the p-type GaN contact layer (p-type semiconductor layer 45) of GaN-based semiconductor layer 40 in semiconductor-layer-attached composite substrate 2, and the Au pad layer (metal pad layer 65) formed on the Ge substrate (transfer support substrate 50) were heat-treated at an ambient temperature of 300° C. and with appropriate pressure application so that they were metal-bonded together, to thereby obtain joined substrate body 3 in which GaN-based semiconductor layer 40 of semiconductor-layer-attached composite substrate 2 and the Ge substrate (transfer support substrate 50) were bonded to each other with connection layer 60 interposed therebetween. Since respective thermal expansion coefficients of the Mo substrate (support substrate 10), GaN layer 21, GaN-based semiconductor layer 40, and the Ge substrate (transfer support substrate 50) were substantially identical to or sufficiently close to each other, no warp and crack occurred to joined substrate body 3.

4. Removal of Support Substrate by Dissolution of the Same

Referring next to FIG. 1(D), the Ge substrate (transfer support substrate 50) side of joined substrate body 3 was protected with wax (not shown), and thereafter joined substrate body 3 was immersed in 30 mass % of nitric acid aqueous solution to thereby dissolve and remove the Mo substrate (support substrate 10) and then immersed in 20 mass % of hydrofluoric acid aqueous solution to thereby dissolve and remove the SiO$_2$ layer (joint layer 30). In this way, semiconductor-layer-attached transfer support substrate 4 was obtained in which GaN-based semiconductor layer 40 and the Ge substrate (transfer support substrate 50) were bonded to each other with connection layer 60 interposed therebetween.

The exposed main surface of GaN layer 21 of semiconductor-layer-attached transfer support substrate 4 had an RMS roughness of 0.36 nm, namely was extremely flat. The results are summarized in Table 1.

5. Fabrication of Semiconductor-Layer-Attached Transfer Support Substrate Into Device and Chip Referring next to FIG. 1(E), on n-type GaN layer 41 exposed by partially removing GaN layer 21 of semiconductor-layer-attached transfer support substrate 4, one Ni/Pt/Au electrode (n-side electrode 70n) was formed per chip by the vacuum deposition method. On the whole surface of the Ge substrate (transfer support substrate 50) of semiconductor-layer-attached transfer support substrate 4, an Ni/Au electrode (p-side electrode 70p) was formed by the vacuum deposition method. In this way, an LED was obtained that was semiconductor device 5 into which semiconductor-layer-attached transfer support substrate 4 was fabricated.

Then, semiconductor device 5 was divided into 100 chips of 400 μm×400 μm in size by the dicing method. 100 semiconductor devices 5 fabricated in the form of chips were mounted on mount substrates respectively with silver paste and wire.

The ratio of acceptable devices in which the leakage current was 100 μA or less when a voltage of 5 V was applied in the opposite direction, relative to 100 mounted semiconductor devices 5 fabricated in the form of chips, namely the yield ratio, was 99%. The results are summarized in Table 1.

Regarding Example 1, the Mo substrate was used as support substrate 10. An LED was fabricated as semiconductor device 5 in a similar manner to Example 1 except that a composite oxide substrate which had a diameter of 4 inches and a thickness of 600 μm and in which Al$_2$O$_3$:SiO$_2$ was 0.64:0.36 was used as support substrate 10 and that 20 mass % of hydrofluoric acid aqueous solution was used as a solvent for dissolving support substrate 10, and the LED was mounted on a mount substrate. The results obtained were similar to those of Example 1. Here, the composite oxide substrate (support substrate 10) in which Al$_2$O$_3$:SiO$_2$ was 0.64:0.36 had a thermal expansion coefficient of $5.5 \times 10^{-6 \circ} C.^{-1}$ which was sufficiently close to the thermal expansion coefficient ($6.0 \times 10^{-6 \circ} C.^{-1}$) of GaN. Moreover, the composite oxide substrate (support substrate 10) in which Al$_2$O$_3$:SiO$_2$ was 0.64:0.36 had its main surface polished, and had an RMS roughness of its main surface of 5 nm or less, and a packing fraction of 98 vol % or more (porosity of 2 vol % or less).

Comparative Example 1

1. Growth of GaN-Based Semiconductor Layer on Sapphire Substrate

Referring to FIG. 4(A), a sapphire substrate (base substrate 100) having a diameter of 4 inches and a thickness of 600 μm and having a (0001) plane as a main surface was prepared. This sapphire substrate (base substrate 100) had an RMS roughness of the main surface of 5 nm or less.

Then, referring to FIG. 4(B), on the sapphire substrate (base substrate 100), the MOVPE method was applied to successively grow an n-type GaN buffer layer 120, an n-type GaN layer (n-type semiconductor layer 141), an InGaN multiple-quantum-well active layer (active layer 143), and a p-type GaN contact layer (p-type semiconductor layer 145), to obtain a semiconductor-layer-attached base substrate 102 including a GaN-based semiconductor layer 140 having an LED structure and a whole thickness of 5 μm. To semiconductor-layer-attached base substrate 102, warp occurred due to a difference in thermal expansion coefficient between the sapphire substrate (base substrate 100), n-type GaN buffer layer 120, and GaN-based semiconductor layer 140.

2. Bonding of Transfer Support Substrate to GaN-Based Semiconductor Layer

Figure 4:
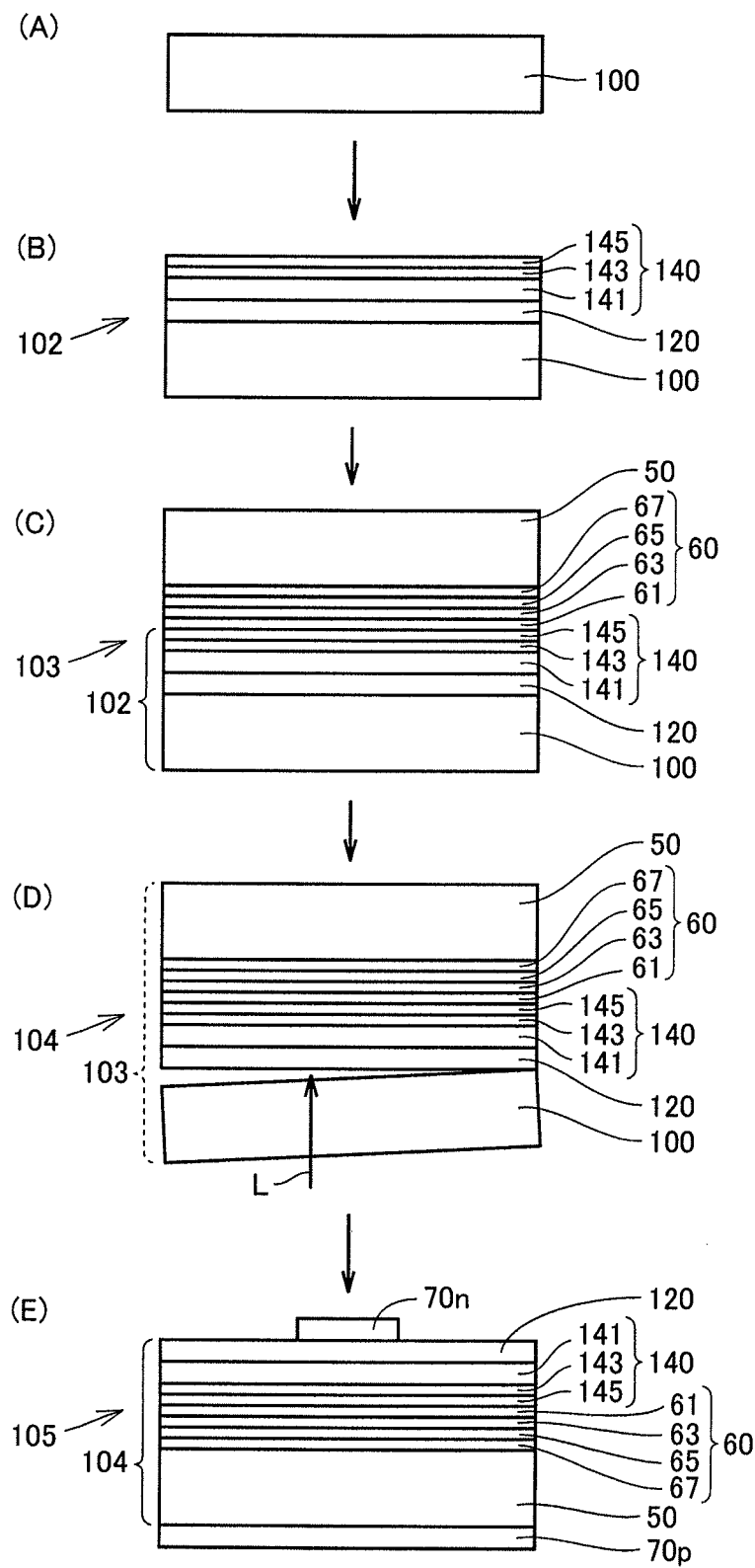
FIG. 4 is a schematic cross section showing an example of the common method of manufacturing a GaN-based semiconductor device.

Then, referring to FIG. 4 (C), on the p-type GaN contact layer (p-type semiconductor layer 145) of GaN-based semiconductor layer 140 of semiconductor-layer-attached base substrate 102, an Ni/Au electrode layer (p-side ohmic electrode layer 61) and an Au—Sn solder layer (solder layer 63) having a thickness of 3 μm that were a part of a connection layer 60 were formed in a similar manner to Example 1.

A Ge substrate (transfer support substrate 50) similar to that of Example 1 was also prepared. On a main surface of this Ge substrate (transfer support substrate 50), an Ni/Pt/Au electrode layer (ohmic electrode layer 67) and an Au pad layer (metal pad layer 65) having a thickness of 1 μm that were a part of connection layer 60 were formed in a similar manner to Example 1.

Subsequently, the Au—Sn solder layer (solder layer 63) formed on the p-type GaN contact layer (p-type semiconductor layer 145) of GaN-based semiconductor layer 140 of semiconductor-layer-attached base substrate 102, and the Au pad layer (metal pad layer 65) formed on the Ge substrate (transfer support substrate 50) were metal-bonded in a similar manner to Example 1 to thereby obtain a joined substrate body 103 in which GaN-based semiconductor layer 140 of semiconductor-layer-attached base substrate 102 and the Ge substrate (transfer support substrate 50) were bonded to each other with connection layer 60 interposed therebetween.

3. Removal of Base Substrate by Laser Lift-Off

Then, referring to FIG. 4(D), from the sapphire substrate (base substrate 100) side of joined substrate body 103, THG (third harmonic generation)-Nd:YAG (neodymium-doped yttrium aluminum garnet) laser beam L of 355 nm in wavelength was applied to thereby thermally decompose the interface portion between n-type GaN buffer layer 120 and the sapphire substrate (base substrate 100) and precipitate Ga droplets, and accordingly the sapphire substrate (base substrate 100) was lifted off to be removed. In this way, a semiconductor-layer-attached transfer support substrate 104 in which GaN-based semiconductor layer 140 and the Ge substrate (transfer support substrate 50) were bonded to each other with connection layer 60 interposed therebetween was obtained.

The exposed main surface of n-type GaN buffer layer 120 of thus obtained semiconductor-layer-attached transfer support substrate 104 was rough with an RMP roughness of 40 nm. The results are summarized in Table 1.

4. Fabrication of Semiconductor-Layer-Attached Transfer Support Substrate Into Device and Chip Then, referring to FIG. 4(E), on a part of the top surface of n-type GaN buffer layer 120 of semiconductor-layer-attached transfer support substrate 104, one Ni/Pt/Au electrode (n-side electrode 70n) similar to that of Example 1 was formed per chip. On the whole top surface of the Ge substrate (transfer support substrate 50) of semiconductor-layer-attached transfer support substrate 104, an Ni/Au electrode (p-side electrode 70p) similar to that of Example 1 was formed. In this way, an LED was obtained that was semiconductor device 105 into which semiconductor-layer-attached transfer support substrate 104 was fabricated.

Then, semiconductor device 105 was divided into 100 chips of 400 μm×400 μm in size in a similar manner to Example 1. 100 semiconductor devices 105 fabricated in the form of chips were mounted on mount substrates respectively with silver paste and wire.

The ratio of acceptable devices in which the leakage current was 100 μA or less measured in a similar manner to Example 1, relative to 100 mounted semiconductor devices 105 fabricated in the form of chips, namely the yield ratio, was 75%. The results are summarized in Table 1.

It should be noted that the Ge substrate was used as transfer support substrate 50 in Example 1 and Comparative Example 1. If an Si substrate is used instead of the Ge substrate as transfer support substrate 50, warp occurs to joined substrate body 3, 103. This is considered as being caused for the following reason. The Ge substrate has a thermal expansion coefficient of $6.1 \times 10^{-6\circ}$ C.$^{-1}$, which is sufficiently close to the thermal expansion coefficient $(6.0 \times 10^{-6\circ}$ C.) of GaN. In contrast, the Si substrate has a thermal expansion coefficient of $4.2 \times 10^{-6\circ}$ C.$^{-1}$, which is not sufficiently close to the thermal expansion coefficient of GaN. Therefore, while it is difficult to use the laser lift-off to remove base substrate 100 of joined substrate body 103, it is possible to remove support substrate 10 by dissolving it.

Example 2

1. Preparation of Composite Substrate

Referring to FIG. 2(A), a composite substrate 1 in which a GaN layer 21 was bonded onto a composite oxide substrate (support substrate 10) in which $Al_2O_3$:$SiO_2$ was 0.64:0.36, between which an $SiO_2$ layer (joint layer 30) was interposed, was prepared in a similar manner to Example 1 except that support substrate 10 that was used was the composite oxide substrate which had a diameter of 4 inches and a thickness of 600 μm and in which $Al_2O_3$:$SiO_2$ was 0.64:0.36, in the following way. It should be noted that the composite oxide substrate (support substrate 10) in which $Al_2O_3$:$SiO_2$ was 0.64:0.36, which was used for preparing composite substrate 1, had a thermal expansion coefficient of $5.5 \times 10^{-6\circ}$ C.$^{-1}$ which was sufficiently close to the thermal expansion coefficient $(6.0 \times 10^{-6\circ}$ C.$^{-1})$ of GaN. In addition, the composite oxide substrate (support substrate 10) had its polished main surface, this main surface had an RMS roughness of 5 nm or less, and the packing fraction of support substrate 10 was 98 vol % or more (porosity thereof was 2 vol % or less).

2. Growth of GaN-Based Semiconductor Layer

Referring next to FIG. 2(B), on GaN layer 21 of composite substrate 1, an n-type GaN layer (n-type semiconductor layer 41), an InGaN multiple-quantum-well active layer (active layer 43), and a p-type GaN contact layer (p-type semiconductor layer 45) were successively grown in a similar manner to Example 1, to obtain a semiconductor-layer-attached composite substrate 2 including GaN-based semiconductor layer 40 having an LED structure and a whole thickness of 5 μm. Since the composite oxide substrate (support substrate 10) in which $Al_2O_3$:$SiO_2$ was 0.64:0.36, GaN layer 21, and GaN-based semiconductor layer 40 had respective thermal expansion coefficients substantially identical or sufficiently close to each other, no warp and crack occurred to semiconductor-layer-attached composite substrate 2.

3. Fabrication of Semiconductor-Layer-Attached Composite Substrate into Device and Chip Referring next to FIG. 2(C), on the whole top surface of the p-type GaN contact layer (p-type semiconductor layer 45) of GaN-based semiconductor layer 40 of semiconductor-layer-attached composite substrate 2, an Ni/Au electrode (p-side electrode 70p) was formed by the vacuum deposition method. Furthermore, a part of the Ni/Au electrode (p-side electrode 70p) as well as a part of the p-type GaN contact layer (p-type semiconductor layer 45) and the InGaN multiple-quantum-well active layer (active layer 43) of GaN-based semiconductor layer 40 were mesa-etched by the ICP-RIE (Inductively Coupled Plasma-Reactive Ion Etching) method to expose a part of the n-type GaN layer (n-type semiconductor layer 41) of GaN-based semiconductor layer 40. On the exposed portion, a Ti/Al electrode (n-side electrode 70n) was formed by the vacuum deposition method. In this way, an LED which was semiconductor device 5 into which semiconductor-layer-attached composite substrate 2 was fabricated was obtained.

Then, semiconductor device 5 was divided into 100 chips of 400 μm×400 μm in size by the scribe-and-break method. The Ni/Au electrode (p-side electrode 70p) and the Ti/Al electrode (n-side electrode 70n) were each covered with a protective electrode formed of an Au pad.

4. Mounting of Semiconductor Device

Referring next to FIG. 2(D), on each of the Ni/Au electrode (p-side electrode 70p) and the Ti/Al electrode (n-side electrode 70n) of semiconductor device 5 fabricated in the form of a chip, an Au ball bump (bump 90) was formed by a ball bonder.

Then, the ultrasonic joining method was used to electrically connect the Ni/Au electrode (p-side electrode 70p) of semiconductor device 5 and a p-side conductive portion 87p of a mount substrate 80, and electrically connect the Ti/Al electrode (n-side electrode 70n) of semiconductor device 5 and an n-side conductive portion 87n of mount substrate 80, with above-described bumps 90 interposed therebetween, to thereby obtain a mounted semiconductor device 6 mounted on mount substrate 80.

5. Removal of Support Substrate by Dissolving the Same

Referring next to FIG. 2(E), the electrode joint portions (p-side electrode 70p, n-side electrode 70n, p-side conductive portion 87p, n-side conductive portion 87n, and bumps 90) as well as their vicinity of mounted semiconductor device 6 mounted on mount substrate 80 were protected with an undercoat of silicone resin, and thereafter mounted semiconductor device 6 was immersed in 20 mass % of hydrofluoric acid aqueous solution, to dissolve and remove the composite oxide substrate (support substrate 10) in which $Al_2O_3:SiO_2$ was 0.64:0.36 and the $SiO_2$ layer (joint layer 30). Accordingly, a mounted semiconductor device 7 was obtained.

The exposed main surface of GaN layer 21 of mounted semiconductor device 7 obtained by removing the composite oxide substrate (support substrate 10) in which $Al_2O_3:SiO_2$ was 0.64:0.36 and the $SiO_2$ layer (joint layer 30) from mounted semiconductor device 6 was extremely flat with an RMS roughness of 0.40 nm. The results are summarized in Table 1.

The ratio of acceptable devices in which the leakage current was 100 µA or less measured in a similar manner to Example 1, relative to 100 mounted semiconductor devices 7 mounted on mount substrates 80 respectively, namely the yield ratio, was 97%. The results are summarized in Table 1.

Example 2 used, as support substrate 10, the composite oxide substrate in which $Al_2O_3:SiO_2$ was 0.64:0.36. A mounted semiconductor device 7 in which an LED which was semiconductor device 5 was mounted on mount substrate 80, was fabricated in a similar manner to Example 2, except that an Mo substrate having a diameter of 4 inches and a thickness of 600 µm was used as support substrate 10, and that 30 mass % of nitric acid aqueous solution was used as a solvent for dissolving support substrate 10. In this case, similar results to Example 2 were obtained. The Mo substrate (support substrate 10) had a thermal expansion coefficient of $6.0 \times 10^{-6 \circ}$ $C.^{-1}$ which was substantially equal to the thermal expansion coefficient ($6.0 \times 10^{-6 \circ} C.^{-1}$) of GaN. This Mo substrate (support substrate 10) has its polished main surface, this main surface had an RMS roughness of 5 nm or less, and the packing fraction of support substrate 10 was 99 vol % or more (porosity thereof was 1 vol % or less).

Comparative Example 2

1. Growth of GaN-Based Semiconductor Layer on Sapphire Substrate

Referring to FIG. 5(A), a sapphire substrate (base substrate 100) having a diameter of 4 inches and a thickness of 600 µm and having a (0001) plane as a main surface was prepared. This sapphire substrate (base substrate 100) had an RMS roughness of the main surface of 5 nm or less.

Then, referring to FIG. 5(B), on the sapphire substrate (base substrate 100), the MOVPE method was applied to successively grow an n-type GaN buffer layer 120, an n-type GaN layer (n-type semiconductor layer 141), an InGaN multiple-quantum-well active layer (active layer 143), and a p-type GaN contact layer (p-type semiconductor layer 145), to obtain a semiconductor-layer-attached base substrate 102 including a GaN-based semiconductor layer 140 having an LED structure and a whole thickness of 5 µm. To semiconductor-layer-attached base substrate 102, warp occurred due to a difference in thermal expansion coefficient between the sapphire substrate (base substrate 100), n-type GaN buffer layer 120, and GaN-based semiconductor layer 140.

2. Fabrication of Semiconductor-Layer-Attached Base Substrate into Device and Chip Then, referring to FIG. 5(C), on the whole top surface of p-type GaN contact layer (p-type semiconductor layer 145) of GaN-based semiconductor layer 140 of semiconductor-layer-attached base substrate 102, the vacuum deposition method was applied to form an Ni/Au electrode (p-side electrode 70p). Moreover, a part of the Ni/Au electrode (p-side electrode 70p) as well as a part of the p-type GaN contact layer (p-type semiconductor layer 145) and the InGaN multiple-quantum-well active layer (active layer 143) of GaN-based semiconductor layer 140 were mesa-etched in a similar manner to Example 2 to expose a part of the n-type GaN layer (n-type semiconductor layer 141) of GaN-based semiconductor layer 140. On the exposed portion, a Ti/Al electrode (n-side electrode 70n) was formed by the vacuum deposition method. In this way, an LED which was semiconductor device 105 into which semiconductor-layer-attached base substrate 102 was fabricated was obtained.

Then, semiconductor device 105 was divided into 100 chips of 400 µm×400 µm in size in a similar manner to Example 2. In a similar manner to Example 2, the Ni/Au electrode (p-side electrode 70p) and the Ti/Al electrode (n-side electrode 70n) were each covered with a protective electrode formed of an Au pad.

3. Mounting of Semiconductor Device

Then, referring to FIG. 5(D), on each of the Ni/Au electrode (p-side electrode 70p) and the Ti/Al electrode (n-side electrode 70n) of semiconductor device 105 fabricated in the form of a chip, a bump 90 was formed in a similar manner to Example 2.

Subsequently, in a similar manner to Example 2, the Ni/Au electrode (p-side electrode 70p) of semiconductor device 105 and a p-side conductive portion 87p of a mount substrate 80 were electrically connected to each other and the Ti/Al electrode (n-side electrode 70n) of semiconductor device 105 and an n-side conductive portion 87n of mount substrate 80 were electrically connected to each other, with above-described bumps 90 interposed therebetween, to thereby obtain a mounted semiconductor device 106 mounted on mount substrate 80.

4. Removal of Base Substrate by Laser Lift-Off

Then, referring to FIG. 5(E), from the sapphire substrate (base substrate 100) side of mounted semiconductor device 106, THG (third harmonic generation)-Nd:YAG (neodymium-doped yttrium aluminum garnet) laser beam L of 355 nm in wavelength was applied to thereby thermally decompose the interface portion between n-type GaN buffer layer 120 and the sapphire substrate (base substrate 100) and precipitate Ga droplets, and accordingly the sapphire substrate (base substrate 100) was lifted off to be removed. In this way, a mounted semiconductor device 107 was obtained.

The exposed main surface of n-type GaN buffer layer 120 of mounted semiconductor device 107 obtained by removal of the sapphire substrate (base substrate 100) of mounted semiconductor device 106 was rough with an RMP roughness of 40 nm. The results are summarized in Table 1.

The ratio of acceptable devices in which the leakage current was 100 μA or less measured in a similar manner to Example 1, relative to 100 mounted semiconductor devices 107 fabricated in the form of chips, namely the yield ratio, was 60%. The results are summarized in Table 1.

TABLE 1

|  | RMS roughness of main surface from which substrate has been removed (nm) | yield ratio of semiconductor devices (%) |
|---|---|---|
| Example 1 | 0.36 | 99 |
| Comparative Example 1 | 40 | 75 |
| Example 2 | 0.40 | 97 |
| Comparative Example 2 | 40 | 60 |

Referring to Table 1, the semiconductor device (Examples 1 and 2) fabricated by dissolving and thereby removing the substrate joined to the GaN-based semiconductor layer has the extremely flat main surface of the GaN-based semiconductor layer that is exposed by removal of the substrate and has less damage to the exposed GaN-based semiconductor layer that is caused when the substrate is removed, as compared with the semiconductor device (Comparative Examples 1 and 2) fabricated using the laser lift-off for removing the substrate joined to the GaN-based semiconductor layer. Thus, semiconductor devices having excellent characteristics can be obtained at a high yield.

The embodiments and examples herein disclosed should be construed as being given by way of illustration in all respects, not by way of limitation. It is intended that the scope of the present invention is defined by claims, not by the description above, and encompasses all modifications and variations equivalent in meaning and scope to the claims.

REFERENCE SIGNS LIST

1 composite substrate; 1P joined substrate; 2 semiconductor-layer-attached composite substrate; 3, 103 joined substrate body; 4, 104 semiconductor-layer-attached transfer support substrate; 5, 105 semiconductor device; 6, 7, 106, 107 mounted semiconductor device; 10 support substrate; 20 GaN substrate; 21 GaN layer; 22 remaining GaN substrate; 30, 31, 32 joint layer; 40, 140 GaN-based semiconductor layer; 41, 141 n-type semiconductor layer; 43, 143 active layer; 45, 145 p-type semiconductor layer; 50 transfer support substrate; 60 connection layer; 61 p-side ohmic electrode layer; 63 solder layer; 65 metal pad layer; 67 ohmic electrode layer; 70*n* n-side electrode; 70*p* p-side electrode; 80 mount substrate; 81 foundation substrate; 87*n* n-side conductive portion; 87*p* p-side conductive portion; 90 bump; 100 base substrate; 102 semiconductor-layer-attached base substrate; 120 n-type GaN buffer layer

The invention claimed is:

1. A method of manufacturing a GaN-based semiconductor device comprising the steps of:
    preparing a composite substrate including: a support substrate having a thermal expansion coefficient at a ratio of not less than 0.8 and not more than 1.2 relative to a thermal expansion coefficient of GaN; and a GaN layer bonded to said support substrate, using an ion implantation separation method;
    growing at least one GaN-based semiconductor layer on said GaN layer of said composite substrate; and
    removing said support substrate of said composite substrate by dissolving said support substrate.

2. The method of manufacturing a GaN-based semiconductor device according to claim 1, further comprising the steps of:
    bonding a transfer support substrate to said GaN-based semiconductor layer, after said step of growing said GaN-based semiconductor layer and before said step of removing said support substrate by dissolving said support substrate; and
    fabricating said transfer support substrate and said GaN-based semiconductor layer into a device and a chip after said step of removing said support substrate by dissolving said support substrate.

3. The method of manufacturing a GaN-based semiconductor device according to claim 1, further comprising the steps of: fabricating said GaN-based semiconductor layer grown on said composite substrate into a device and a chip; and mounting said GaN-based semiconductor layer fabricated into a device and a chip on a mount substrate, after said step of growing said GaN-based semiconductor layer and before said step of removing said support substrate by dissolving said support substrate.

4. The method of manufacturing a GaN-based semiconductor device according to claim 2, wherein said support substrate includes at least one selected from the group consisting of molybdenum and a composite oxide of aluminum oxide and silicon oxide.

5. The method of manufacturing a GaN-based semiconductor device according to claim 1, wherein said support substrate includes at least one selected from the group consisting of molybdenum and a composite oxide of aluminum oxide and silicon oxide.

6. The method of manufacturing a GaN-based semiconductor device according to claim 3, wherein said support substrate includes at least one selected from the group consisting of molybdenum and a composite oxide of aluminum oxide and silicon oxide.

* * * * *